(12) United States Patent
Yee

(10) Patent No.: US 11,579,473 B2
(45) Date of Patent: Feb. 14, 2023

(54) DISPLAY DEVICE HAVING UNIFORM REFLECTANCE

(71) Applicant: Samsung Display Co., LTD., Yongin-si (KR)

(72) Inventor: Dong-su Yee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 428 days.

(21) Appl. No.: 16/776,603

(22) Filed: Jan. 30, 2020

(65) Prior Publication Data

US 2020/0310166 A1 Oct. 1, 2020

(30) Foreign Application Priority Data

Mar. 28, 2019 (KR) .................. 10-2019-0036194

(51) Int. Cl.
*G02F 1/01* (2006.01)
*G02B 1/11* (2015.01)
*H01L 27/32* (2006.01)

(52) U.S. Cl.
CPC .............. *G02F 1/0102* (2013.01); *G02B 1/11* (2013.01); *G02F 1/0136* (2013.01); *H01L 27/326* (2013.01); *H01L 27/3223* (2013.01)

(58) Field of Classification Search
CPC ....... G02F 1/0102; G02F 1/0136; G02B 1/11; H01L 27/3223; H01L 27/326; H01L 51/5262
See application file for complete search history.

(56) References Cited

U.S. PATENT DOCUMENTS

2013/0001610 A1* 1/2013 Iwakura .............. H01L 27/3223
257/91
2017/0098796 A1 4/2017 Yee
2017/0102491 A1 4/2017 Lee

FOREIGN PATENT DOCUMENTS

| JP | 2009-199852 A | 9/2009 |
| JP | 2015-005342 A | 1/2015 |
| KR | 1020170039809 A | 4/2017 |
| KR | 1020170125639 A | 11/2017 |

OTHER PUBLICATIONS

European Search Report for European Patent Application No. 20164160.2 dated Sep. 3, 2020.

* cited by examiner

*Primary Examiner* — Donald L Raleigh
(74) *Attorney, Agent, or Firm* — Cantor Colburn LLP

(57) ABSTRACT

A display device includes a display panel including: a display area at which an image is displayed and a bezel area which is adjacent to the display area, and a pixel including a pixel circuit and a light emitting layer, the pixel circuit defining a stacked structure; a window; and a pattern film between the display panel and the window, the pattern film including: a first film including a first area and a second area which respectively correspond to the display area and the bezel area of the display panel, and a pattern layer on the second film in the second area thereof. The pattern layer of the pattern film includes a same stacked structure as the stacked structure defined by the pixel circuit of the display panel.

20 Claims, 11 Drawing Sheets

DISPLAY DEVICE HAVING UNIFORM REFLECTANCE

This application claims priority to Korean Patent Application No. 10-2019-0036194, filed on Mar. 28, 2019, and all the benefits accruing therefrom under 35 U.S.C. § 119, the contents of which are hereby incorporated by reference in its entirety.

BACKGROUND

1. Field

The present disclosure relates to a display device having a bezel area.

2. Description of the Related Art

A display device displays various images on a display screen to provide a user with information. The display device includes a display area at which the image is displayed and a bezel area which is adjacent to the display area. The bezel area of the display device may have a predetermined color, and the display device includes a printed layer disposed in the bezel area to provide the predetermined color.

SUMMARY

The present disclosure provides a display device in which a distinction between a display area and a bezel area is minimized when an image is not displayed.

Embodiments of the invention provide a display device including a display panel including: a display area at which an image is displayed and a bezel area which is adjacent to the display area, a first film corresponding to the display area and the bezel area, and a pixel on the first film, the pixel including a pixel circuit and a light emitting layer, the pixel circuit defining a stacked structure; a window; and a pattern film between the display panel and the window, the pattern film including: a second film including a first area and a second area which respectively correspond to the display area and the bezel area of the display panel, and a pattern layer on the second film in the second area thereof. The pattern layer of the pattern film includes a same stacked structure as the stacked structure defined by the pixel circuit of the display panel.

The display device may further include a polarizing film disposed between the window and the pattern film, the polarizing film corresponding to the first area and the second area of the pattern film.

The display panel may further include a dummy pixel including a dummy pixel circuit and a dummy light emitting layer.

The pixel of the display panel may correspond to the display area of the display panel and the dummy pixel may correspond to the bezel area of the display panel.

The dummy pixel may be provided in plurality including a plurality of dummy pixels respectively corresponding to the first area and the second area of the pattern film.

The pattern layer may be disposed between the window and the second film.

The pattern layer may be disposed between the second film and the display panel.

The pattern layer may include a first sub-pattern layer disposed on the first film and a second sub-pattern layer disposed on the first sub-pattern layer, the first sub-pattern layer may have a same stacked structure as the pixel circuit, and the second sub-pattern layer may include a same material as the light emitting layer.

The display panel may further include a thin film encapsulation layer covering the light emitting layer.

The pattern layer may include a first sub-pattern layer disposed on the first film and a second sub-pattern layer disposed on the first sub-pattern layer, the first sub-pattern layer may have a same stacked structure as the pixel circuit, and the second sub-pattern layer may have a same stacked structure as the thin film encapsulation layer.

The pattern layer may include a first sub-pattern layer disposed on the first film, a second sub-pattern layer disposed on the first sub-pattern layer, and a third sub-pattern layer disposed on the second sub-pattern layer, the first sub-pattern layer may have a same stacked structure as the pixel circuit, the second sub-pattern layer may include a same material as the light emitting layer, and the third sub-pattern layer may have a same stacked structure as the thin film encapsulation layer.

The display device may further include a colored adhesive layer disposed under the display panel.

The display device may further include an input sensing layer disposed between the display panel and the first film.

A reflectance and a transmittance of light incident to the display device at the display area of the display panel may be respectively equal to a reflectance and a transmittance of light incident to the display device at the second area of the pattern film.

Embodiments of the invention provide a display device including a display panel including a display area at which an image is displayed and a bezel area which is adjacent to the display area; a window; and a pattern film between the display panel and the window, the pattern film including: a first film including a transmission area corresponding to the display area of the display panel, and a pattern layer on the first film and corresponding to the bezel area of the display panel. A reflectance of external light incident to the display device at an area corresponding to the display area of the display panel is equal to a reflectance of external light incident to the display device at an area corresponding to the pattern layer of the pattern film.

The display panel may further include a second film corresponding to the display area and the bezel area, and a pixel on the second film, the pixel including a pixel circuit and a light emitting layer, the pixel circuit defining a stacked structure, and the pattern layer may include a first sub-pattern layer having a same stacked structure as the pixel circuit.

The pattern layer may further include a second sub-pattern layer disposed on the first sub-pattern layer and having a same stacked structure as the light emitting layer.

The display device may further include an encapsulation layer covering the pixel, and the pattern layer may further include a second sub-pattern layer disposed on the first sub-pattern layer and having a same stacked structure as the encapsulation layer.

The display device may further include a polarizing film disposed between the window and the pattern film, and a planar area of the polarizing film may be equal to a planar area of the window.

The display panel may further include a plurality of dummy pixels each including a dummy pixel circuit and a dummy light emitting layer, the pixel of the display panel may correspond to the display area of the display panel, and the dummy pixels may correspond to both the transmission area and the pattern layer.

According to the above, the pattern layer defines the bezel area of the display device and may have the same stacked structure and layout as those of components within the display panel. The pattern layer may be provided or formed by a same process used to manufacture the components of the display panel and by using the same material or same material layer applied to the display panel for forming such components. Therefore, the difference in reflectance and transmittance of external light incident to the display device at areas corresponding to the display panel and the pattern film in which the pattern layer is disposed may be reduced. Thus, the display device in which the distinction between the display area and the bezel area is minimized when the image is not displayed may be provided.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
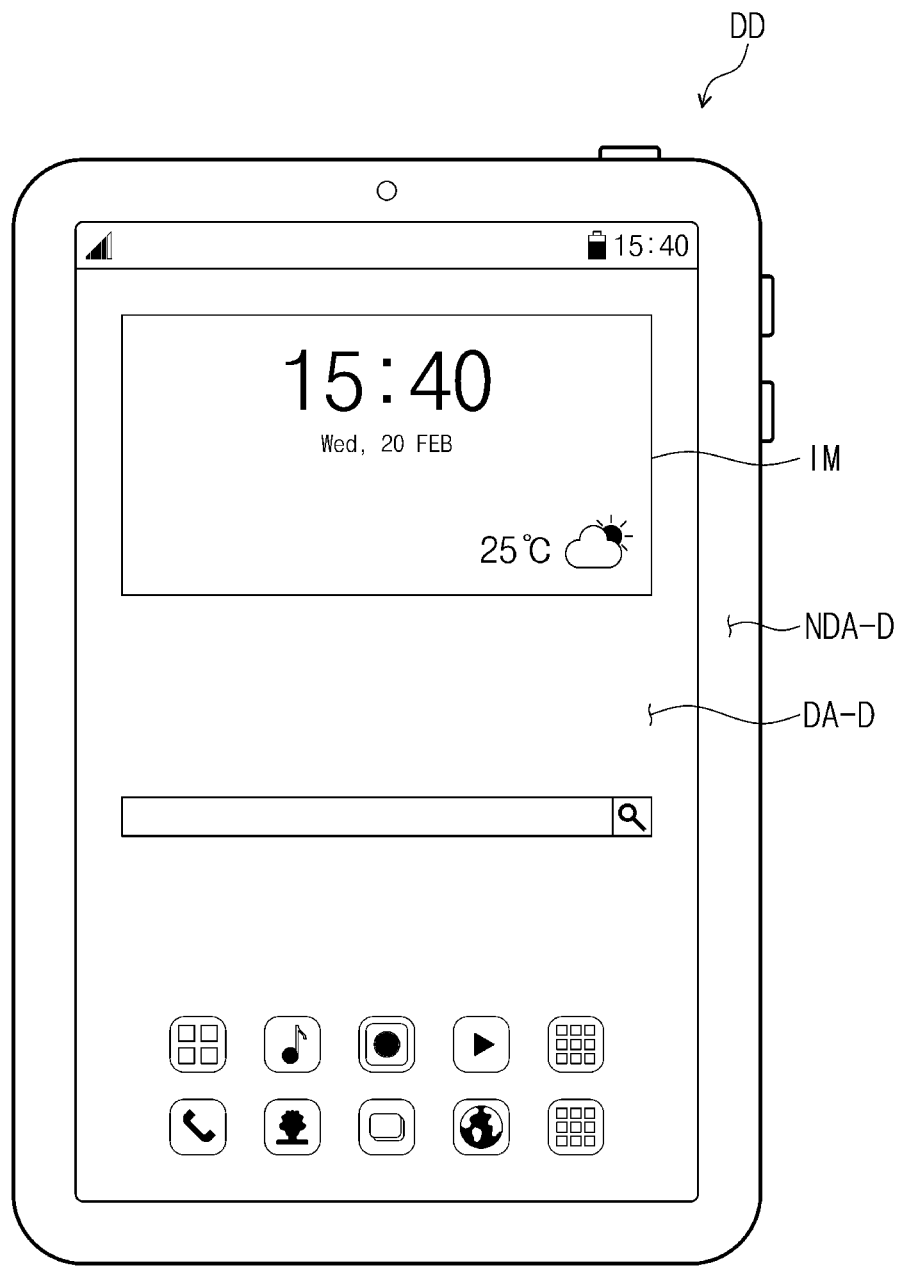
FIG. 1 is a top plan view illustrating an exemplary embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

In the following descriptions, it will be understood that when an element or layer is referred to as being related to another element such as being "on," "connected to" or "coupled to" another element or layer, the element or layer can be directly on, connected or coupled to the other element or layer or intervening elements or layers may be present. In contrast when an element or layer is referred to as being related to another element such as being "directly on," "directly connected to" or "directly coupled to" another element or layer, no intervening elements or layers are present therebetween.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

As used herein, the singular forms, "a," "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be further understood that the terms "comprises," "includes" and/or "including", when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the present disclosure will be explained in detail with reference to the accompanying drawings.

FIG. 1 is a top plan view illustrating an exemplary embodiment of a display device DD.

Referring to FIG. 1, the display device DD may be a device activated in response to an electrical signal. Activation of the display device DD may generate and/or emit light, generate an image and/or display an image to outside the display device DD via a display screen thereof. The display device DD may include various embodiments. In exemplary embodiments, for example, the display device DD may be applied to a relatively large-sized electronic item, such as a television set, a display monitor, or an outdoor billboard, and a relatively small and medium-sized electronic item, such as a personal computer, a notebook computer, a personal digital assistant, a car navigation unit, a game unit, a mobile electronic device, and a camera. These are merely exemplary, and thus the display device DD may be applied to other electronic devices without departing from the concept of the present disclosure. In the present exemplary embodiment, a tablet computer will be described as a representative example of the display device DD.

The display device DD may include a display area DA-D and a bezel area NDA-D. An image may be displayed at the display area DA-D. An image may not be displayed at the bezel area NDA-D, but is not limited thereto or thereby. The display device DD may include or define a surface that is substantially parallel to a plane defined by a first direction DR1 and a second direction DR2 which cross each other. The display device DD may display an image IM toward a third direction DR3, such that the image IM is visible from outside the display device DD. The image IM may include a motion (e.g., moving) image and a still image. FIG. 1 illustrates a clock window and icons as a representative example of the image IM. The bezel area NDA-D is adjacent to the display area DA-D. In an exemplary embodiment, the bezel area NDA-D may surround the display area DA-D in the top plan view. The image IM may not be displayed at the bezel area NDA-D. The display area DA-D may be defined by the bezel area NDA-D. The display area DA-D and the bezel area NDA-D may define a total planar area of the display device DD in the top plan view, without being limited thereto.

In the present exemplary embodiment, front (or upper) and rear (or lower) surfaces of each member of the display device DD are defined with respect to a direction in which the image IM is displayed. The front and rear surfaces face each other along the third direction DR3, and a normal line direction of each of the front and rear surfaces is substantially parallel to the third direction DR3. Directions indicated by the first, second, and third directions DR1, DR2, and DR3 are relative to each other, and thus the directions indicated by the first, second, and third directions DR1, DR2, and DR3 may be changed to other directions. In the following descriptions, the expression "when viewed in a plan view" may mean a state being viewed along the third direction DR3.

The display device DD may include electronic modules. The electronic modules may overlap with the bezel area NDA-D when viewed in a plan view. However, this is merely exemplary, and the present disclosure should not be limited thereto or thereby. In exemplary embodiments, for example, some of the electronic modules may overlap with the display area DA-D when viewed in a plan view.

The electronic modules may include a camera module with which an external image is photographed, a proximity illuminance sensor module with which the illuminance of an environment external to the display device DD and the proximity of an object in such environment are measured, an infrared light emitting module with which an infrared light is output from the display device DD, and a light receiving module with which infrared light is sensed by the display device DD. In the exemplary embodiment of the present disclosure, the display device DD may further include a sound output module with which a sound is output from the display device DD or a thermal sensing module with which heat is sensed by the display device DD in addition to the above-mentioned electronic modules. In exemplary embodiments, at least one of the electronic modules may be omitted.

Figure 2:
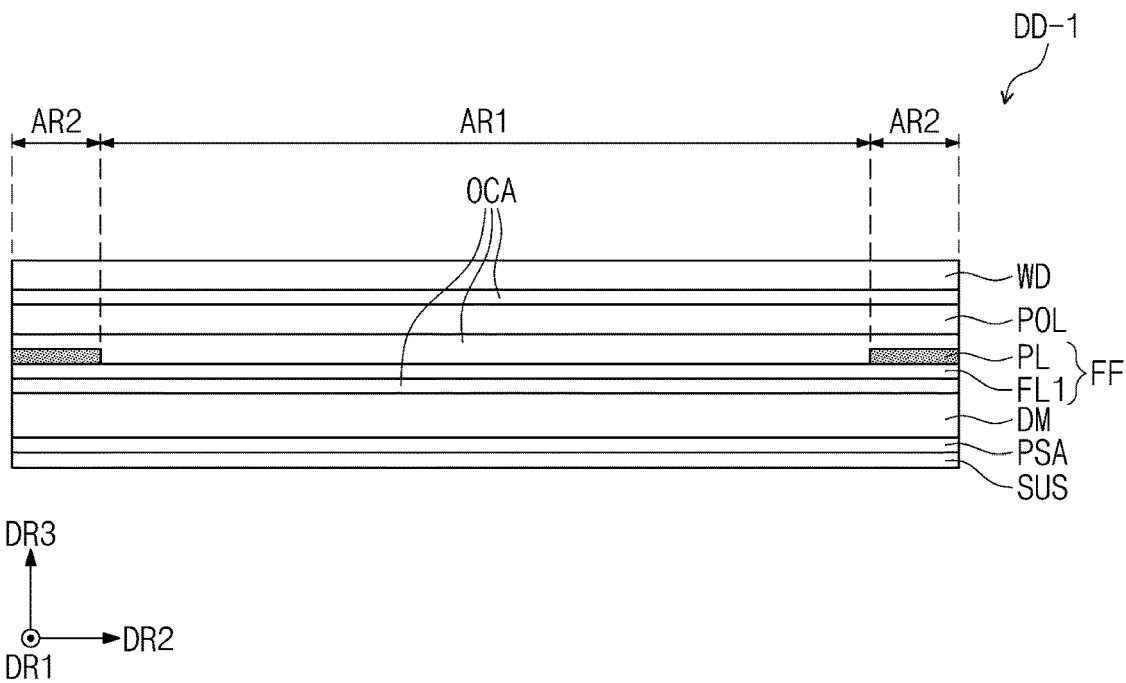
FIG. 2 is a cross-sectional view illustrating an exemplary embodiment of a display device.

FIG. 2 is a cross-sectional view illustrating an exemplary embodiment of a display device DD-1. FIG. 2 illustrates a cross-section defined by the second direction DR2 and the third direction DR3. FIG. 2 is illustrated in a simple manner to explain a stacking relationship of functional members of the display device DD-1.

Referring to FIG. 2, the display device DD-1 may include a window WD, a polarizing film POL, a pattern film FF, a display module DM, an adhesive layer PSA, and a plate SUS.

The window WD and the polarizing film POL, the polarizing film POL and the pattern film FF, and the pattern film FF and the display module DM may be respectively coupled to each other by an adhesive member OCA (e.g., plurality of adhesive members OCA). The adhesive member OCA may include a conventional adhesive or pressure sensitive adhesive. In an exemplary embodiment, for example, the adhesive member OCA may be an optically transparent adhesive.

The window WD may be a layer providing an outermost surface of the display device DD-1. The window WD may include a glass substrate, a synthetic resin film, or a composite film. The window WD may further include a functional coating layer. The functional coating layer may include an anti-fingerprint layer, an anti-reflective layer, and a relatively hard coating layer.

The polarizing film POL may be disposed under the window WD. The polarizing film POL may reduce a reflectance of an external light incident thereto from outside the display device DD-1 (e.g., above of the window WD in FIG. 2).

The polarizing film POL according to the exemplary embodiment of the present disclosure may include a retarder and a polarizer. The retarder may be a film type or liquid crystal coating type and may include a $\lambda/2$ retarder and/or a $\lambda/4$ retarder. The polarizer may be a film type and may include a stretched-type synthetic resin film. The retarder and the polarizer may further include a protective film. The retarder and the polarizer together or the protective film alone may be defined as a base layer of the polarizing film POL.

The polarizing film POL may have substantially the same planar area as the planar area of the window WD when viewed in a plan view. The aforementioned planar areas may be a total planar area of a respective member, without being limited thereto. In an exemplary embodiment, for example, the polarizing film POL may overlap with the display area DA-D and the bezel area NDA-D shown in FIG. 1. Since the polarizing film POL is attached to an entire surface of the window WD, a distinction of a boundary between the display area DA-D and the bezel area NDA-D may be reduced when the image IM (refer to FIG. 1) is not displayed at the display area DA-D.

The pattern film FF may be disposed under the polarizing film POL. The pattern film FF may include a first film FL1 (e.g., a first substrate FL1) and a pattern layer PL (e.g., light shielding pattern PL).

The first film FL1 may include or define a first area AR1 and a second area AR2 which is adjacent to the first area AR1, such as surrounding the first area AR1 in the top plan view, without being limited thereto. The first area AR1 may correspond to the display area DA-D of FIG. 1, and the second area AR2 may correspond to the bezel area NDA-D of FIG. 1. In addition, the first are AR1 may be a transmission area of the display device DD at which light and/or an image from the display module DM is transmittable, and the second area AR2 may be a light shielding area of the display device DD at which light from the display module DM is not transmittable (e.g., shielded). The first film FL1 may be, but not limited to, a plastic film. In an exemplary embodiment, for example, the first film FL1 may include a polyimide-based resin.

The pattern layer PL may be disposed on a surface of the first film FL1. In an exemplary embodiment, for example, the surface may be an upper surface of the first film FL1, which faces the window WD. Accordingly, the pattern layer PL may be disposed between the window WD and the first film FL1 along a thickness direction (e.g., third direction DR3) of the display device DD-1.

The pattern layer PL may partially overlap with the first film FL1. The pattern layer PL may be disconnected along the first film FL1 (e.g., along the first direction DR1 and/or the second direction DR2). When viewed in a plan view, the pattern layer PL may overlap with the second area AR2 and may not overlap with the first area AR1. That is, the bezel area NDA-D (refer to FIG. 1) may correspond to and/or be defined by the pattern layer PL.

According to the exemplary embodiment of the present disclosure, a difference in reflectance between areas of the display device DD-1 respectively corresponding to the pattern layer PL and a display panel DP of the display module DM and a difference in transmittance between areas of the display device DD-1 respectively corresponding to the pattern layer PL and the display panel DP of the display module DM may be reduced. Accordingly, when the display module DM does not provide the image, the distinction of a boundary between the first area AR1 and the second area AR2 may be minimized. Detailed descriptions thereof will be given later.

The display module DM may be disposed under the pattern film FF. The display module DM may generate and/or display the image. In addition, the display module DM may sense an external input incident thereto or to the display device DD-1. The external input may be a user input which is incident to the display device DD-1 using an input tool such as a portion of user's body, light, heat, pen, or pressure.

The adhesive layer PSA may be disposed under the display module DM. The adhesive layer PSA may be colored such as including a dye having a color (e.g., a colored adhesive layer PSA). The colored adhesive layer PSA is disposed facing the pattern film FF with the display panel DP disposed therebetween. In an embodiment, for example, the adhesive layer PSA may be a pressure sensitive adhesive in which a black dye is included. A light incident into the adhesive layer PSA may be absorbed by the adhesive layer PSA. Therefore, reflection of incident light from outside the display device DD may be reduced or effectively prevented. The dye having the color may be combined with a base material or matrix of the adhesive layer PSA, to provide color thereto.

The plate SUS may be disposed under the adhesive layer PSA. The plate SUS may include a material having a relatively higher rigidity than the display module DM. In an exemplary embodiment, for example, the plate SUS may include a plurality of frames and/or plates, which includes a glass, plastic, metal alloy, or a combination thereof.

Figure 3:
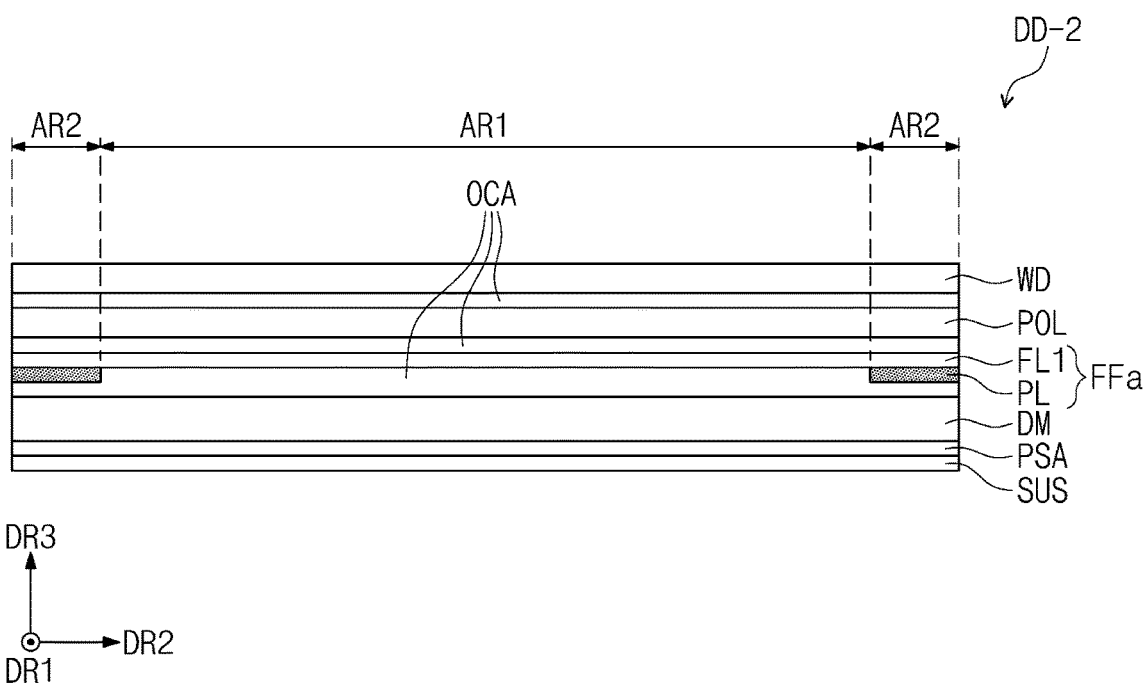
FIG. 3 is a cross-sectional view illustrating another exemplary embodiment of a display device.

FIG. 3 is a cross-sectional view illustrating another exemplary embodiment of a display device DD-2.

Referring to FIG. 3, the display device DD-2 may include a window WD, a polarizing film POL, a pattern film FFa, a display module DM, an adhesive layer PSA, and a plate SUS.

The pattern film FFa may include a first film FL1 and a pattern layer PL. The pattern layer PL may be disposed on a surface of the first film FL1. In an exemplary embodiment, for example, the surface may be a bottom surface of the first film FL1, which faces the display module DM. Accordingly, the pattern layer PL may be disposed between the first film FL1 and the display module DM.

Figure 4:
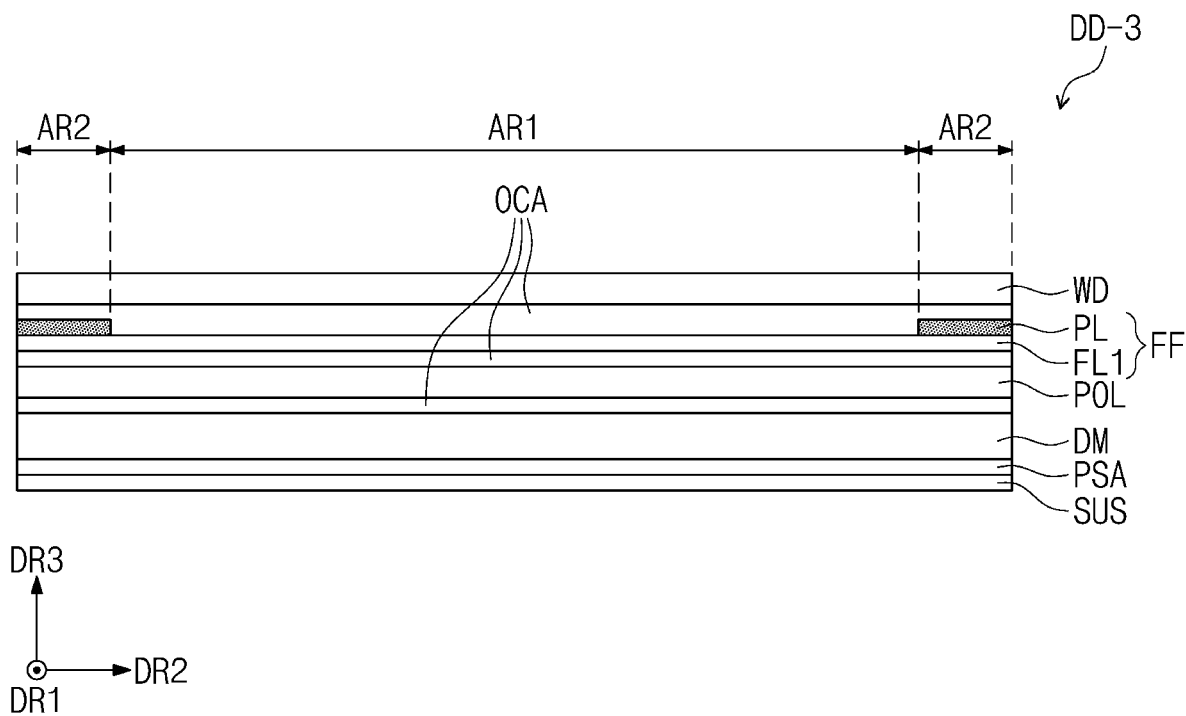
FIG. 4 is a cross-sectional view illustrating still another exemplary embodiment of a display device.

FIG. 4 is a cross-sectional view illustrating still another exemplary embodiment of a display device DD-3.

Referring to FIG. 4, the display device DD-3 may include a window WD, a pattern film FF, a polarizing film POL, a display module DM, an adhesive layer PSA, and a plate SUS. The pattern film FF may be disposed under the window WD, and the polarizing film POL may be disposed under the pattern film FF.

The display device DD described with reference to FIG. 1 may be any one of the display devices DD-1, DD-2, and DD-3 described with reference to FIGS. 2 to 4.

Figure 5A:
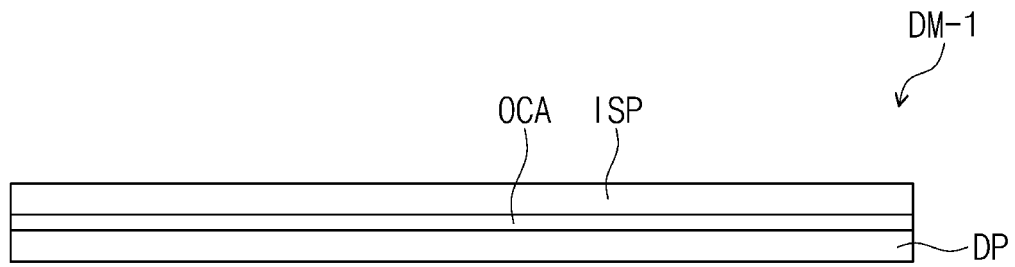
FIG. 5A is a cross-sectional view illustrating an exemplary embodiment of a display module.
Figure 5A:
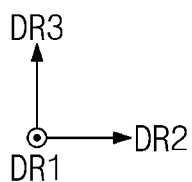
Figure 5B:
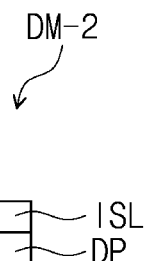
FIG. 5B is a cross-sectional view illustrating another exemplary embodiment of a display module.
Figure 5B:
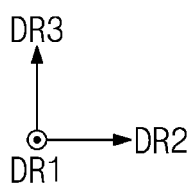

FIG. 5A is a cross-sectional view illustrating an exemplary embodiment of a display module DM-1. FIG. 5B is a cross-sectional view illustrating another exemplary embodiment of a display module DM-2. The display module DM described in FIGS. 2 to 4 may include the display module DM-1 of FIG. 5A or the display module DM-2 of FIG. 5B Referring to FIG. 5A, the display module DM-1 may include a display panel DP, an adhesive member OCA, and an input sensing panel ISP. The display panel DP and the input sensing panel ISP may be coupled to each other by the adhesive member OCA.

The display panel DP may be a light emitting type display panel, but is not particularly limited. In an exemplary embodiment, for instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP.

The input sensing panel ISP may be disposed on the display panel DP with an adhesive member OCA therebetween to attach the two components to each other. The input sensing panel ISP may include a plurality of insulating layers and a plurality of conductive layers. The conductive layers may form a sensing electrode with which the external input may be sensed by the display module DM-1, a sensing line that is connected to the sensing electrode, and a sensing pad that is connected to the sensing line. The input sensing panel ISP may sense the external input in a mutual capacitance manner and/or a self-capacitance manner, however, the sensing manner for the external input should not be limited thereto or thereby.

Referring to FIG. 5B, the display module DM-2 may include a display panel DP and an input sensing layer ISL. The input sensing layer ISL may be directly disposed on the display panel DP. In the following descriptions, the expression that a component "B" is directly disposed on a component "A" means that no intervening elements, such as an adhesive layer/an adhesive member, are present between the component "B" and the component "A". Such direct relationship may be used to distinguish a "layer" from a "panel." In an exemplary embodiment, a "layer" may include the component "B" is formed on a base surface provided by the component "A" through successive processes after the component "A" is formed.

Figure 6:
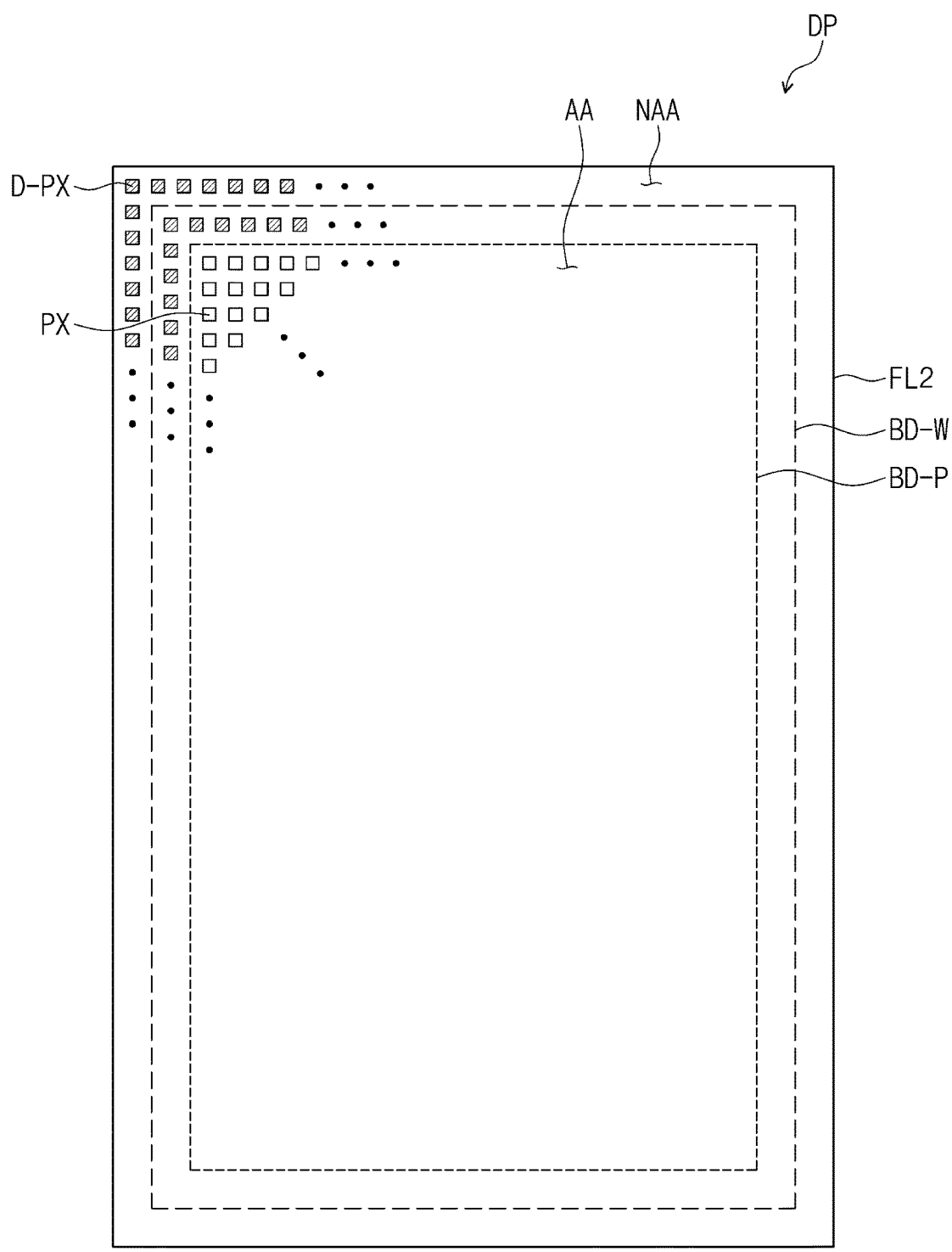
FIG. 6 is a top plan view illustrating an exemplary embodiment of a display panel.
Figure 7:
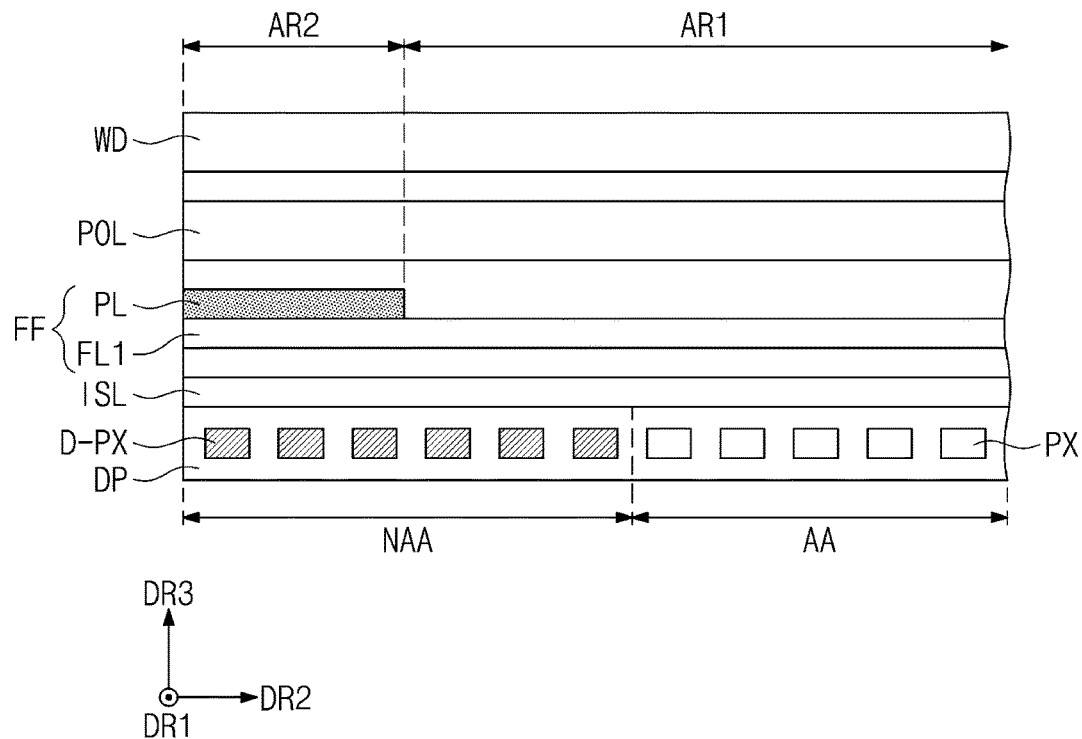
FIG. 7 is an enlarged cross-sectional view illustrating an exemplary embodiment of a portion of a display device.

FIG. 6 is a top plan view illustrating an exemplary embodiment of a display panel DP. FIG. 7 is an enlarged cross-sectional view illustrating a portion of the display device DD including a display panel DP.

Referring to FIGS. 6 and 7, the display panel DP may include a second film FL2 (e.g., a second substrate FL2) and a pixel PX provided in plural (e.g., pixels PX) on the second film FL2. At the pixel PX, light may be emitted, an image may be generated and/or an image may be displayed, such as to constitute a display pixel PX.

The second film FL2 may be a relatively rigid film or a relatively flexible film. The second film FL2 may be a glass substrate or a plastic substrate. The plastic substrate may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin. As an example, the second film FL2 may include a single-layer structure of the polyimide-based resin, however, should not be limited thereto or thereby. That is, the second film FL2 may be a stacked structure including a plurality of insulating layers.

The display panel DP may include or define an active area AA (e.g., display area AA) and a peripheral area NAA which is adjacent to the active area AA, such as surrounding the active area AA in the top plan view. The active area AA may be provided with the image by the pixels PX. That is, an image may be displayed at the active area AA. An image may not be displayed at the peripheral area NAA, but is not limited thereto or thereby.

FIG. 6 illustrates a boundary BD-W (hereinafter, referred to as a "pattern boundary") between the first area AR1 (refer to FIG. 2) and the second area AR2 (refer to FIG. 2) of the first film FL1, and a boundary BD-P (hereinafter referred to as a "active boundary") between the active area AA and the peripheral area NAA of the display panel DP. The pattern boundary BD-W may correspond to a boundary between the display area DA-D (refer to FIG. 1) and the bezel area NDA-D (refer to FIG. 1). That is, the first area AR1 of the first film FL1 includes a portion of the peripheral area NAA of the display panel DP.

The pattern boundary BD-W may not overlap with the active boundary BD-P when viewed in a plan view. In an exemplary embodiment, for example, the active boundary BD-P may be surrounded by the pattern boundary BD-W. Since the first area AR1 is a transmission area, the entire active area AA and a portion of the peripheral area NAA may be recognized through the first area AR1.

According to the exemplary embodiment of the present disclosure, the display panel DP may further include a dummy pixel D-PX provided in plural (e.g., dummy pixels D-PX). The dummy pixels D-PX may be arranged in the peripheral area NAA. When viewed a plan view, some of the dummy pixels D-PX may be in (e.g., overlap with) the second area AR2, and the others of the dummy pixels D-PX may be in (e.g., overlap with) the first area AR1. That is, some of the dummy pixels D-PX may be covered by the pattern layer PL. In addition, portions of the peripheral area NAA in which the dummy pixels D-PX are not arranged or excluded may be covered by the pattern layer PL. Such portions include planar areas between dummy pixels D-PX which are adjacent to each other along the first direction DR1 and/or the second direction DR2.

The dummy pixels D-PX may not emit light, may not generate an image and may not display the image but may include a same stacked structure and layout as those of the pixel PX. Accordingly, the reflectance and the transmittance of light incident to the display device DD at the active area AA (e.g., display area AA) of the display panel DP by the stacked structure and layout may be substantially the same as the reflectance and the transmittance of light incident to the display device DD at the peripheral area NAA of the display panel DP. According to the exemplary embodiment of the present disclosure, since the reflectance and the transmittance in the active area AA are substantially the same as those in the peripheral area NAA, the active boundary BD-P may not be recognized when the display panel DP does not display the image. In the present disclosure, the layout may mean an arrangement relationship of conductive wiring lines and patterns when the display panel DP is viewed in a plan view.

In the present disclosure, the expression that the transmittances are the same may be interpreted to mean substantially the same. The expression that the reflectances are the same may be interpreted to mean substantially the same. In an exemplary embodiment, for example, the transmittances may be the same within a predetermined deviation. And, the relectances may be the same within a predetermined deviation. The predetermined deviation may be within about 5%. Numerical values given as the predetermined deviation are merely exemplary, and the predetermined deviation should not be limited thereto or thereby.

Figure 8:
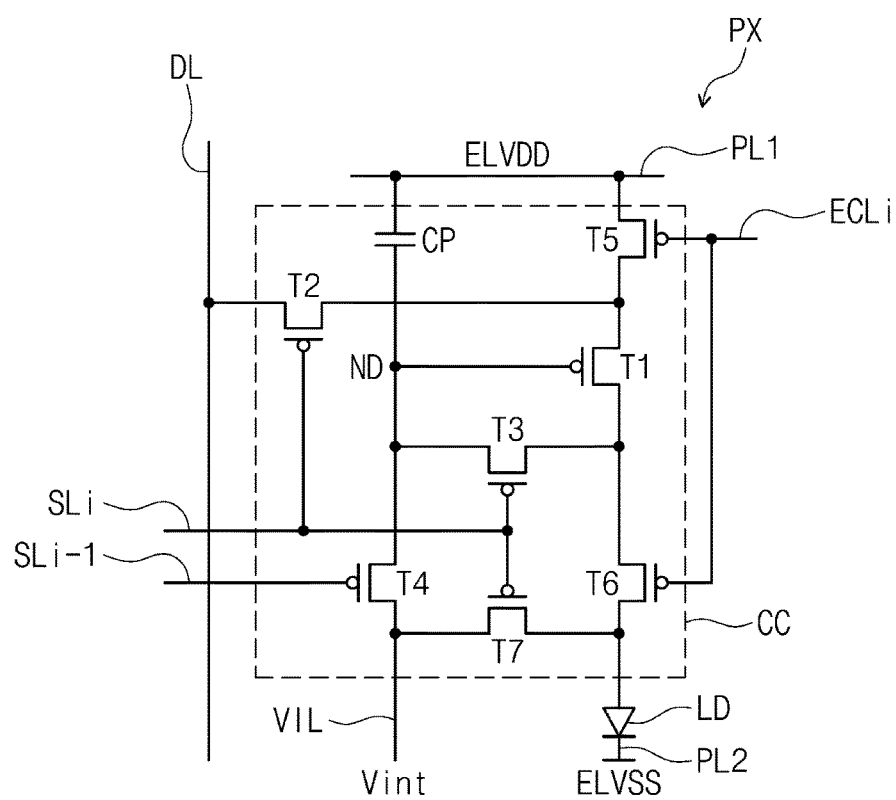
FIG. 8 is an equivalent circuit diagram illustrating an exemplary embodiment of a pixel.

FIG. 8 is an equivalent circuit diagram illustrating an exemplary embodiment of a pixel PX.

Referring to FIG. 8, the pixel PX is disposed in the active area AA (refer to FIG. 6) of the display panel DP and is an element with which light may be emitted, an image may be generated and/or the image may be displayed.

The pixel PX may be electrically connected to a plurality of signal lines. As scan lines, FIG. 8 illustrates scan lines SLi and SLi−1, a data line DL, a first power line PL1, a second power line PL2, an initialization power line VIL, and a light emitting control line ECLi among the signal lines. The pixel PX according to the exemplary embodiment of the present disclosure may be further connected to various signal lines not exemplified in FIG. 8, and some of the signal lines shown in FIG. 8 may be omitted.

The pixel PX may include a light emitting element LD and a pixel circuit CC which is connected to the light emitting element. The pixel circuit CC may include a plurality of transistors T1 to T7 and a capacitor CP. The pixel circuit CC may control an amount of electrical current flowing through the light emitting element LD in response to an electrical signal such as a data signal.

The light emitting element LD may generate and/or emit a light at a predetermined luminance in response to the amount of electrical current provided from the pixel circuit CC. To this end, a first power ELVDD may have a level that is set higher than a level of a second power ELVSS.

Each of the transistors T1 to T7 may include an input electrode (or source electrode), an output electrode (or drain electrode), and a control electrode (or gate electrode). In the following descriptions, for the convenience of explanation, one electrode of the input electrode and the output electrode may be referred to as a "first electrode" and the other electrode of the input electrode and the output electrode may be referred to as a "second electrode".

A first electrode of a first transistor T1 is connected to the first power line PL1 via a fifth transistor T5. The first power line PL1 may be a line to which the first power ELVDD is applied. A second electrode of the first transistor T1 is connected to an anode electrode of the light emitting element LD via a sixth transistor T6. The first transistor T1 may be referred to as a "driving transistor" in the present disclosure.

The first transistor T1 controls the amount of electrical current flowing through the light emitting element LD in response to a voltage applied to a control electrode of the first transistor T1.

A second transistor T2 is connected between the data line DL and the first electrode of the first transistor T1. A control electrode of the second transistor T2 is connected to an i-th scan line SLi. When an i-th scan signal is applied to the i-th scan line SLi, the second transistor T2 is turned on and electrically connects the data line DL to the first electrode of the first transistor T1.

A third transistor T3 is connected between the second electrode of the first transistor T1 and the control electrode of the first transistor T1. A control electrode of the third transistor T3 is connected to the i-th scan line SLi. When the i-th scan signal is applied to the i-th scan line SLi, the third transistor T3 is turned on and electrically connects the second electrode of the first transistor T1 to the control electrode of the first transistor T1. Accordingly, when the third transistor T3 is turned on, the first transistor T1 is connected in a diode configuration.

A fourth transistor T4 is connected between a node ND and the initialization power line VIL. A control electrode of the fourth transistor T4 is connected to an (i−1)th scan line SLi−1. The node ND may be a node at which the fourth transistor T4 is connected to the control electrode of the first transistor T1. When an (i−1)th scan signal is applied to the (i−1)th scan line SLi−1, the fourth transistor T4 is turned on and provides an initialization voltage Vint to the node ND.

The fifth transistor T5 is connected between the first power line PL1 and the first electrode of the first transistor T1. The sixth transistor T6 is connected between the second electrode of the first transistor T1 and the anode electrode of the light emitting element LD. A control electrode of the fifth transistor T5 and a control electrode of the sixth transistor T6 are connected to an i-th light emitting control line ECLi.

A seventh transistor T7 is connected between the initialization power line VIL and the anode electrode of the light emitting element LD. A control electrode of the seventh transistor T7 is connected to the i-th scan line SLi. When the i-th scan signal is applied to the i-th scan line SLi, the seventh transistor T7 is turned on and provides the initialization voltage Vint to the anode electrode of the light emitting element LD.

The seventh transistor T7 may improve a black expression ability of the pixel PX. In detail, when the seventh transistor T7 is turned on, a parasitic capacitance (not shown) of the light emitting element LD is discharged. Accordingly, when implementing a black luminance, the light emitting element LD does not emit the light due to a leakage of electrical current from the first transistor T1, and thus the black expression ability may be improved.

Additionally, in FIG. 8, the control electrode of the seventh transistor T7 is connected to the i-th scan line SLi, however, it should not be limited thereto or thereby. According to another embodiment, the control electrode of the seventh transistor T7 may be connected to the (i−1)th scan line SLi−1 or an (i+1)th scan line (not shown).

FIG. 8 illustrates a PMOS as a reference of the pixel circuit CC, however, should not be limited thereto or thereby. According to another embodiment, the pixel circuit CC may be implemented by an NMOS. According to another embodiment, the pixel circuit CC may be implemented by a combination of the NMOS and the PMOS.

The capacitor CP is disposed between the first power line PL1 and the node ND. The capacitor CP is charged with a voltage corresponding to the data signal. When the fifth and sixth transistors T5 and T6 are turned on due to the voltage charged in the capacitor CP, the amount of the electrical current flowing through the first transistor T1 may be determined.

The light emitting element LD may be electrically connected to the sixth transistor T6 and the second power line PL2. The light emitting element LD may receive the second power ELVSS via the second power line PL2.

The light emitting element LD may generate and/or emit the light with the voltage corresponding to a difference between the electrical signal provided through the sixth transistor T6 and the second power ELVSS provided through the second power line PL2.

In the present disclosure, the structure of the pixel PX should not be limited to the structure shown in FIG. 8. According to another embodiment of the present disclosure, the pixel PX may be implemented in various ways to allow the light emitting element LD to generate and/or emit the light.

In addition, the dummy pixels D-PX (refer to FIG. 7) may include the same equivalent circuit as the pixel PX described in FIG. 8. That is, the dummy pixels D-PX may include the same layout defined above as an arrangement relationship of conductive wiring lines and patterns of the pixel PX described in FIG. 8. In an exemplary embodiment for example, the dummy pixel D-PX may include a dummy pixel circuit CC and a dummy light emitting element LD. The dummy pixel circuit CC may correspond to the pixel circuit CC, and the dummy light emitting element LD may correspond to the light emitting element LD. The dummy pixel circuit CC may define a dummy stacked structure of the display panel DP and the pixel circuit CC may define a stacked structure of the display panel DP.

Figure 9:
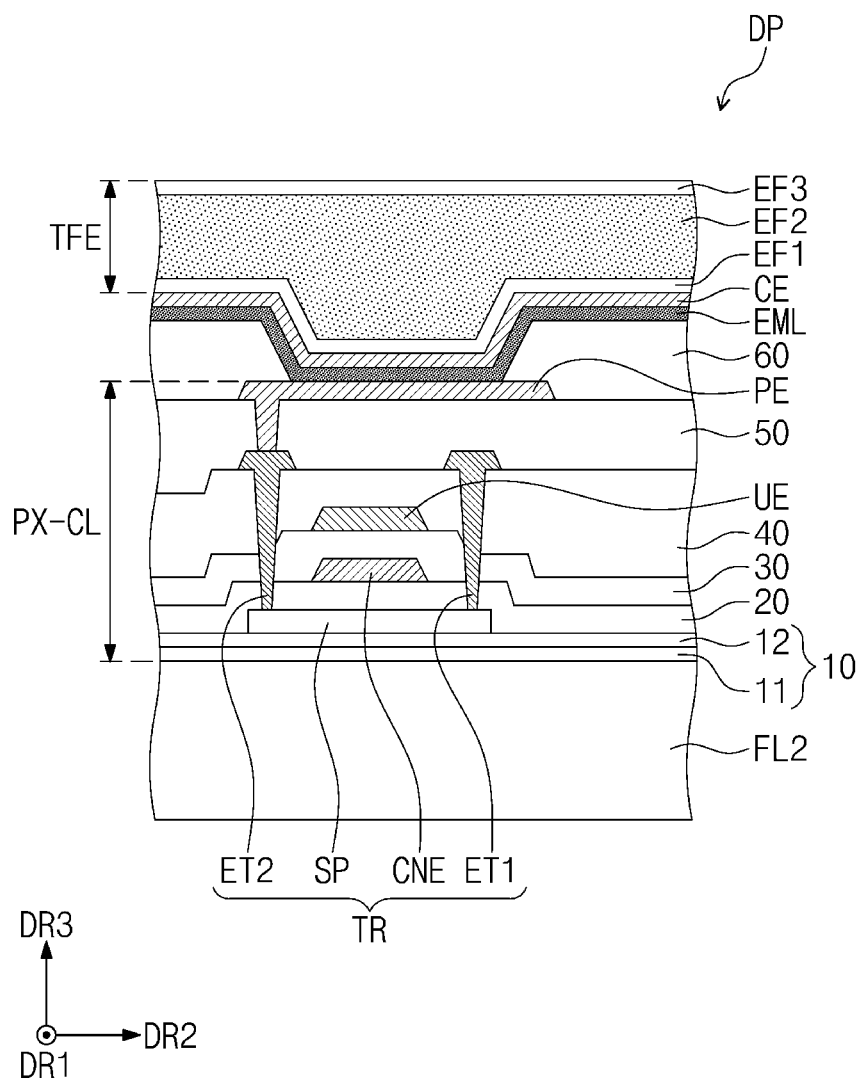
FIG. 9 is an enlarged cross-sectional view illustrating an embodiment of a display panel.

FIG. 9 is an enlarged cross-sectional view illustrating an embodiment of the display panel DP. The arrangement relationship of conductive wiring lines and patterns in FIG. 9 may be included in the pixel PX, without being limited thereto.

Referring to FIG. 9, a first insulating layer 10 may be disposed on the second film FL2. The first insulating layer 10 may include a barrier layer 11 and a buffer layer 12.

The barrier layer 11 may include an inorganic material. The barrier layer 11 may reduce or effectively prevent oxygen or moisture inflowing through the second film FL2 from entering the pixels PX (refer to FIG. 6) and the dummy pixels D-PX (refer to FIG. 6) defined on the second film FL2.

The buffer layer 12 may include an inorganic material. The buffer layer 12 may provide a surface energy lower than that of the second film FL2 to the pixels PX so that the pixels PX are stably provided or formed on the second film FL2.

In FIG. 9, each of the barrier layer 11 and the buffer layer 12 is shown as provided in singular, however, this is merely exemplary. Each of the barrier layer 11 and the buffer layer 12 may be provided in a plural number, and the barrier layers 11 may be alternately stacked with the buffer layers 12. As another exemplary embodiment, at least one of the barrier layer 11 and the buffer layer 12 may be provided in a plural number or may be omitted.

Each of the pixels PX (refer to FIG. 6) may include the pixel circuit CC (refer to FIG. 8) and a light emitting layer EML. FIG. 9 illustrates only one transistor TR. The transistor TR may correspond to the sixth transistor T6 described in FIG. 8.

The transistor TR may be disposed on the first insulating layer 10. The transistor TR may include a semiconductor pattern SP, a control electrode CNE, a first electrode ET1, and a second electrode ET2. The semiconductor pattern SP may be disposed on the first insulating layer 10. The semiconductor pattern SP may include a semiconductor material. The control electrode CNE may be spaced apart from the semiconductor pattern SP with a second insulating layer 20 interposed therebetween.

The first electrode ET1 and the second electrode ET2 may be respectively connected to opposing sides of the semiconductor pattern SP by the first electrode ET1 and the second electrode ET2 respectively penetrating through the second insulating layer 20, a third insulating layer 30, and a fourth insulating layer 40 at contact holes therein. The transistor TR according to the exemplary embodiment of the present disclosure may be implemented in various stacked structures and should not be limited to the structure illustrated in FIG. 9.

An upper electrode UE may be disposed between the third insulating layer 30 and the fourth insulating layer 40. The upper electrode UE may be connected to an electrode of the capacitor CP described in FIG. 8.

A fifth insulating layer 50 may be disposed on the fourth insulating layer 40 to cover the first electrode ET1 and the second electrode ET2. The fifth insulating layer 50 may include an organic material and/or an inorganic material and may have a single-layer or multi-layer structure.

A pixel electrode PE may be disposed on the fifth insulating layer 50. The pixel electrode PE may be electrically connected to the transistor TR by penetrating through the fifth insulating layer 50 at a contact hole therein.

In the present disclosure, the structure from the first insulating layer 10 to the pixel electrode PE may be referred to as a "pixel circuit layer PX-CL". The stacked structure defined by the pixel circuit CC (refer to FIG. 8) may correspond to a cross-sectional structure of the pixel circuit layer PX-CL.

A sixth insulating layer 60 may be disposed on the fifth insulating layer 50. An opening may be defined through the sixth insulating layer 60, and at least a portion of the pixel electrode PE may be exposed through the opening. The sixth insulating layer 60 may be referred to as a "pixel definition layer." The opening in the sixth insulating layer 60 may correspond to a light emitting area of the pixel PX, without be limited thereto.

The light emitting layer EML may be disposed on the pixel electrode PE exposed through the opening defined through the sixth insulating layer 60. The light emitting layer EML may include a light emitting material. In an exemplary embodiment, for example, the light emitting layer EML may include at least one material among materials respectively emitting red, green and blue lights. The light emitting layer EML may include a fluorescent material or a phosphorescent material. The light emitting layer EML may include an organic light emitting material or an inorganic light emitting material. The light emitting layer EML may define a stacked structure by one or more of the aforementioned materials. The light emitting layer EML may emit the light in response to a difference in electric potential between the pixel electrode PE and a common electrode CE.

The common electrode CE may be disposed on the light emitting layer EML. The common electrode CE may extend from the active area AA of the display panel DP (refer to FIG. 6) to the peripheral area NAA of the display panel DP (refer to FIG. 6) to have a single unitary form. The common electrode CE may be commonly provided relative to a plurality of the pixels PX (refer to FIG. 6).

The common electrode CE may include a transmissive conductive material or a semi-transmissive conductive material. Accordingly, the light generated by the light emitting layer EML may easily travel along the third direction DR3 to outside the display panel DP after passing through the common electrode CE (e.g., top surface light emitting manner). However, this is merely exemplary, and the light emitting element LD (refer to FIG. 8) according to the exemplary embodiment of the present disclosure may be operated in a rear surface light emitting manner in which the pixel electrode PE includes the transmissive or semi-transmissive material such that the light generated by the light emitting layer EML may easily travel along the third direction DR3 to outside the display panel DP after passing through the pixel electrode PE or a multi-surface light emitting manner in which the light is emitted at both of the front and rear surfaces of the display panel DP, and should not be limited to a specific embodiment. In the present disclosure, the light emitting element LD may collectively include the pixel electrode PE, the light emitting layer EML, and the common electrode CE.

A thin film encapsulation layer TFE may be disposed on the common electrode CE to encapsulate the light emitting layer EML on the second film FL2. The thin film encapsulation layer TFE may extend from the active area AA of the display panel DP (refer to FIG. 6) to the peripheral area NAA of the display panel DP (refer to FIG. 6) to have a single unitary form. Although not shown in figures, a capping layer may be further disposed between the common electrode CE and the thin film encapsulation layer TFE to cover the common electrode CE.

The thin film encapsulation layer TFE may include a first inorganic layer EF1, an organic layer EF2, and a second inorganic layer EF3, which are sequentially stacked along the third direction DR3. That is, the thin film encapsulation layer TFE may define a stacked structure including one or more among the first inorganic layer EF1, the organic layer EF2, and the second inorganic layer EF3. In the present exemplary embodiment, each of the first inorganic layer EF1, the organic layer EF2, and the second inorganic layer EF3 may be provided in singular, however, this is merely exemplary. At least one of the first inorganic layer EF1, the organic layer EF2, and the second inorganic layer EF3 may be provided in a plural number or may be omitted, however, should not be limited to a particular embodiment.

The first inorganic layer EF1 may cover the common electrode CE. The first inorganic layer EF1 may reduce or effectively prevent external moisture or oxygen from entering the light emitting layer EML. In an exemplary embodiment, for example, the first inorganic layer EF1 may include silicon nitride, silicon oxide, or a combination pound thereof. The first inorganic layer EF1 may be formed by a deposition process in an embodiment of a method of manufacturing a display device DD.

The organic layer EF2 may be disposed on the first inorganic layer EF1 to make contact with the first inorganic layer EF1. The organic layer EF2 may provide a flat surface on the first inorganic layer EF1.

An uneven shape formed by the upper surface of the first inorganic layer EF1 and particles existing on the first inorganic layer EF1 may be covered with the organic layer EF2, and thus an influence of a surface state of the upper surface of the first inorganic layer EF1 having the uneven shape or particles, on components subsequently provided or formed on the organic layer EF2, may be blocked. In addition, the organic layer EF2 may relieve a stress between layers within thin film encapsulation layer TFE making contact with each other. The organic layer EF2 may include an organic material and may be formed by a solution process, such as a spin coating, slit coating, or an inkjet process in an embodiment of a method of manufacturing a display device DD.

The second inorganic layer EF3 may be disposed on the organic layer EF2 to cover the organic layer EF2. The second inorganic layer EF3 may be stably provided or formed on a relatively flat surface as compared to the surface on which the first inorganic layer EF1 is provided or formed. The second inorganic layer EF3 may encapsulate or absorb moisture leaked from the organic layer EF2 to reduce or effectively prevent the moisture from transmitting to the outside the second inorganic layer EF3. The second inorganic layer EF3 may include silicon nitride, silicon oxide, or a combination thereof. The second inorganic layer EF3 may be provided or formed by a deposition process in an embodiment of a method of manufacturing a display device DD.

Referring to FIG. 9 and FIGS. 10 to 13 described below, layers 11-P, 12-P, 20-P, 30-P, 40-P, UE-P, 50-P, PE-P, 60-P, EML-P, CE-P, EF1-P, EF2-P, EF3-P, ET2-P, SP-P, CNE-P and ET1-P may respectively correspond to layers 11, 12, 20, 30, 40, UE, 50, PE, 60, EM, CE, EF1, EF2, EF3, ET2, SP, CNE and ET1 described above.

Figure 10:
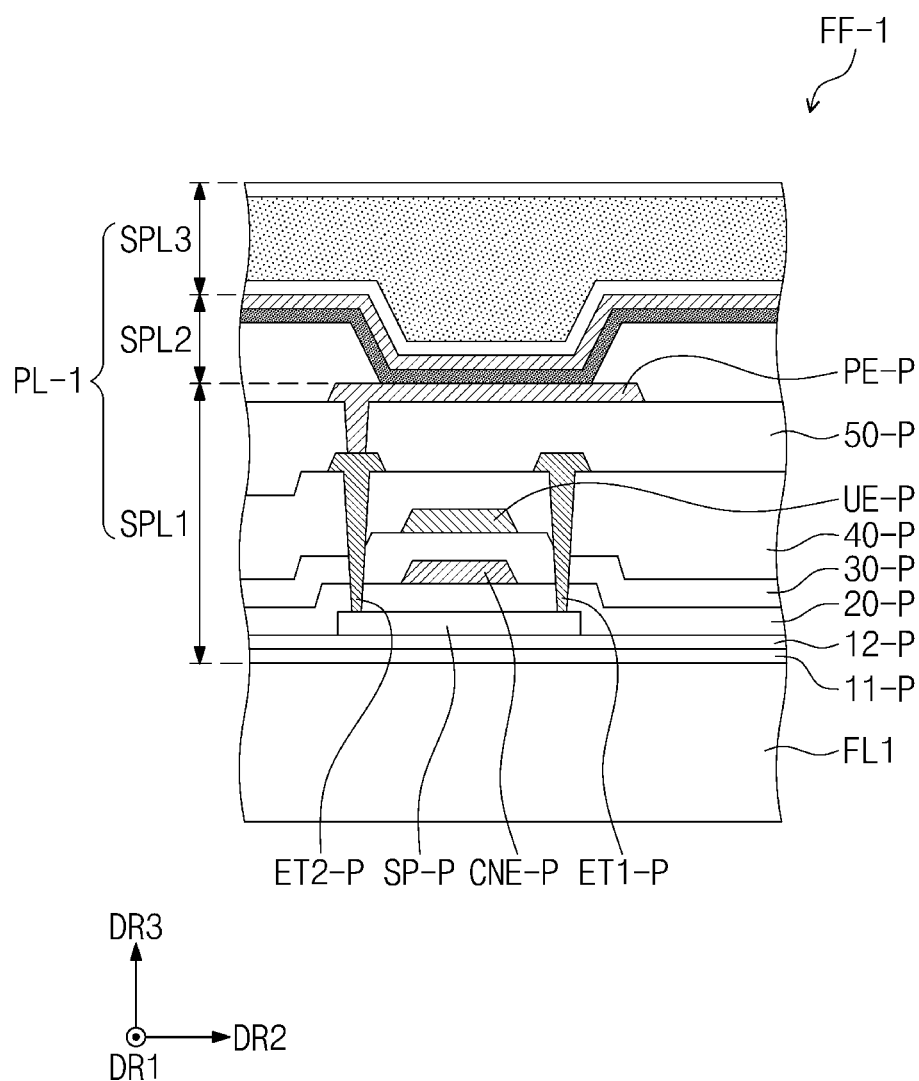
FIG. 10 is an enlarged cross-sectional view illustrating an exemplary embodiment of a pattern film.

FIG. 10 is an enlarged cross-sectional view illustrating an exemplary embodiment of a pattern film FF-1. The arrangement relationship of conductive wiring lines and patterns in FIG. 10 may be included in the dummy pixel D-PX, without being limited thereto. The pattern film FF and the pattern film FFa described in FIGS. 2 to 4 may include the pattern film FF-1 of FIG. 10.

Referring to FIGS. 9 and 10, the pattern film FF-1 may include a first film FL1 and a pattern layer PL-1. The pattern layer PL-1 may include a first sub-pattern layer SPL1, a second sub-pattern layer SPL2, and a third sub-pattern layer SPL3 in order from the first film FL1.

The first sub-pattern layer SPL1 may be disposed on a surface of the first film FL1, the second sub-pattern layer SPL2 may be disposed on the first sub-pattern layer SPL1, and the third sub-pattern layer SPL3 may be disposed on the second sub-pattern layer SPL2.

The first sub-pattern layer SPL1 may have or be defined by substantially the same stacked structure as that of the pixel circuit layer PX-CL. In an exemplary embodiment of a display device DD, the stacked structure providing the first sub-pattern layer SPL1 on the first film FL1 and the stacked structure providing the pixel circuit layer PX-CL on the second film FL2 may be provided or formed by a same process, without being limited thereto. The stacked structure providing the first sub-pattern layer SPL1 on the first film FL1 may include portions of one or more of the same material layer as that included in the stacked structure providing the pixel circuit layer PX-CL on the second film FL2.

Similar to the first sub-pattern layer SPL1, the second sub-pattern layer SPL2 may include or be defined by the same layer or the same material layer as the light emitting layer EML. In addition, the second sub-pattern layer SPL2 may further include layers having the same material and the same structure as those of the sixth insulating layer 60 and the common electrode CE as well as the light emitting layer EML.

Similar to the first sub-pattern layer SPL1, the third sub-pattern layer SPL3 may have the same stacked structure as the thin film encapsulation layer TFE.

According to the exemplary embodiment of the present disclosure, the pattern layer PL-1 on the first film FL1 may have the same stacked structure and the same layout as those of the components disposed on the second film FL2 of the display panel DP. In an exemplary embodiment of a method of manufacturing a display device DD, the pattern layer PL-1 may be provided or formed using same materials or layers thereof used to manufacture the display panel DP through the same processes used to manufacture the display panel DP.

In a case where a plurality of first masks is used to form the pixel circuit layer PX-CL, the first sub-pattern layer SPL1 may be formed using masks having the same mask pattern as the first masks. In an exemplary embodiment, for example, in a case where the pixel circuit layer PX-CL includes wiring or signal lines including titanium or molybdenum, the first sub-pattern layer SPL1 may have elements having the same material and the same pattern as those of the wiring or signal lines. The second sub-pattern layer SPL2 may be provided or formed using the same material or layers thereof and the same process, which are used to form the sixth insulating layer 60, the light emitting layer EML, and the common electrode CE. In addition, the third sub-pattern layer SPL3 may be providing or formed using the same material or layers thereof and the same process, which are used to form the thin film encapsulation layer TFE.

The degree of reflection and refraction of the light incident to the pattern layer PL-1 from outside of the display device DD may be similar to the degree of reflection and refraction of light incident to the display panel DP from outside the display device DD. That is, the reflectance and transmittance of the display panel DP may be substantially the same as the reflectance and transmittance of the pattern film FF-1 on which the pattern layer PL-1 is disposed.

According to the exemplary embodiment of the present disclosure, the pattern layer PL-1 of the pattern film FF (refer to FIG. 10) that defines the bezel area NDA-D (refer to FIG. 1) of the display device DD may be substantially the same as the configuration above the second film FL2 of the display panel DP (refer to FIG. 9). Accordingly, the bezel area NDA-D of the display device DD may have similar transmittance, reflectance and color as those of the display area DA-D (refer to FIG. 1) of the display device DD not only in a variety of environments, such as under the sunlight or under the fluorescent lamp, but also at various angles at which the display device DD (refer to FIG. 1) is viewed. As a result, the distinction of the boundary between the bezel area NDA-D and the display area DA-D may be minimized when the image is not displayed.

Figure 11:
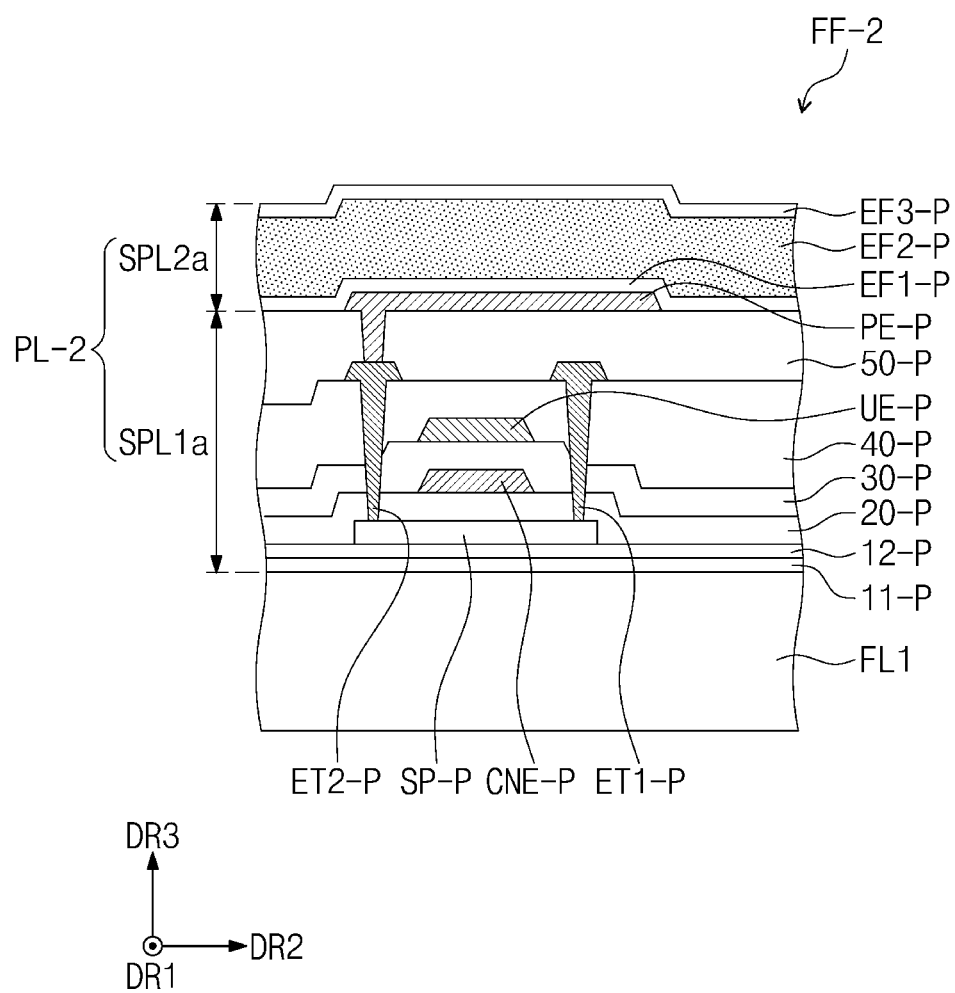
FIG. 11 is an enlarged cross-sectional view illustrating another exemplary embodiment of a pattern film.

FIG. 11 is an enlarged cross-sectional view illustrating another exemplary embodiment of a pattern film FF-2.

Referring to FIGS. 9 and 11, the pattern film FF-2 may include a first film FL1 and a pattern layer PL-2. The pattern layer PL-2 may include a first sub-pattern layer SPL1a and a second sub-pattern layer SPL2a.

Referring to the pattern layer PL-1 described in FIG. 10, the pattern layer PL-2 of FIG. 11 may not include layers corresponding to components disposed between the pixel circuit layer PX-CL and the thin film encapsulation layer TFE. In an exemplary embodiment, for example, the first sub-pattern layer SPL1a may have the same stacked structure as the pixel circuit layer PX-CL, and the second sub-pattern layer SPL2a may have the same stacked structure as the thin film encapsulation layer TFE.

Since the pattern layer PL-2 has a stacked structure instead of a conventional pattern layer which is provided or formed by a printing method, a difference in reflectance between the pattern layer PL-2 and the display panel DP and a difference in transmittance between the pattern layer PL-2 and the display panel DP may be reduced. Therefore, the display device DD in which the distinction between the display area DA-D and the bezel area NDA-D is minimized may be provided when the image is not displayed.

Figure 12:
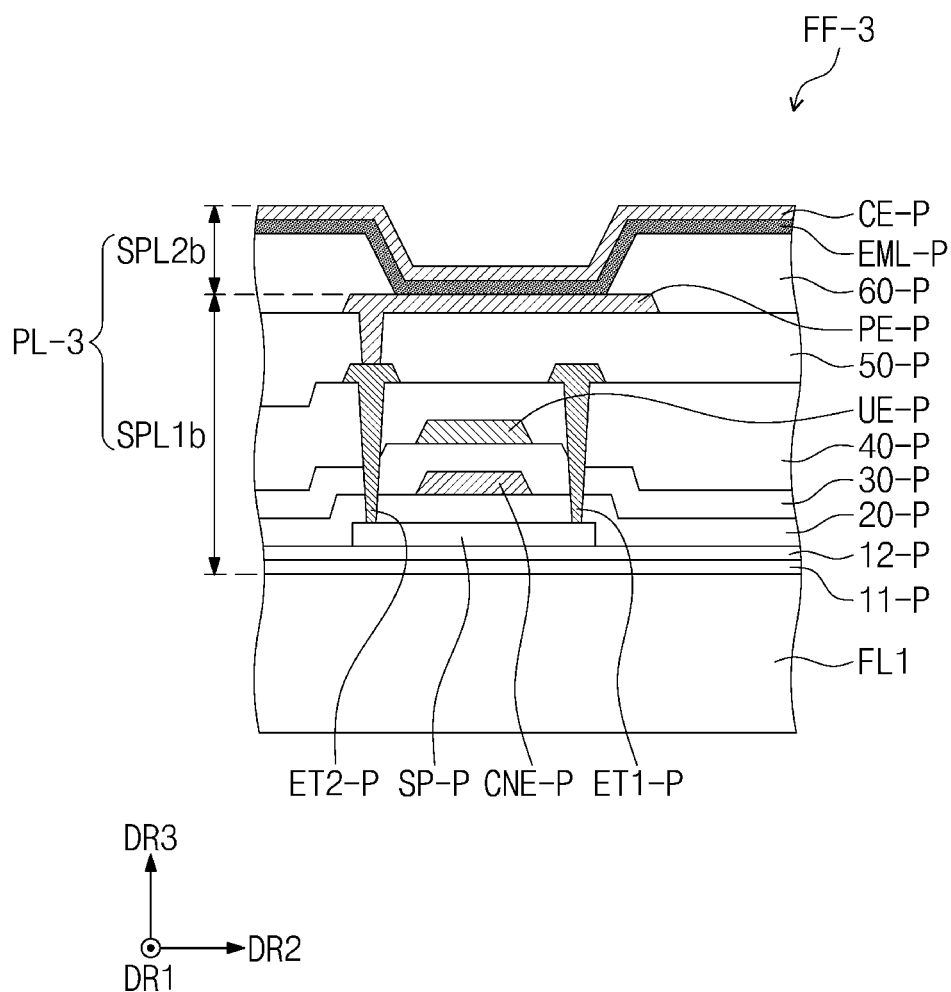
FIG. 12 is an enlarged cross-sectional view illustrating still another exemplary embodiment of a pattern film.

FIG. 12 is an enlarged cross-sectional view illustrating still another exemplary embodiment of a pattern film FF-3.

Referring to FIGS. 9 and 12, the pattern film FF-3 may include a first film FL1 and a pattern layer PL-3. The pattern layer PL-3 may include a first sub-pattern layer SPL1b and a second sub-pattern layer SPL2b. Referring to the pattern layer PL-1 described in FIG. 10, the pattern layer PL-3 of FIG. 12 may not include layers corresponding to the thin film encapsulation layer TFE.

The first sub-pattern layer SPL1b may have the same stacked structure as the pixel circuit layer PX-CL. The second sub-pattern layer SPL2b may include layers having the same material and the same structure as those of the light emitting layer EML, the sixth insulating layer 60, and the common electrode CE.

Figure 13:
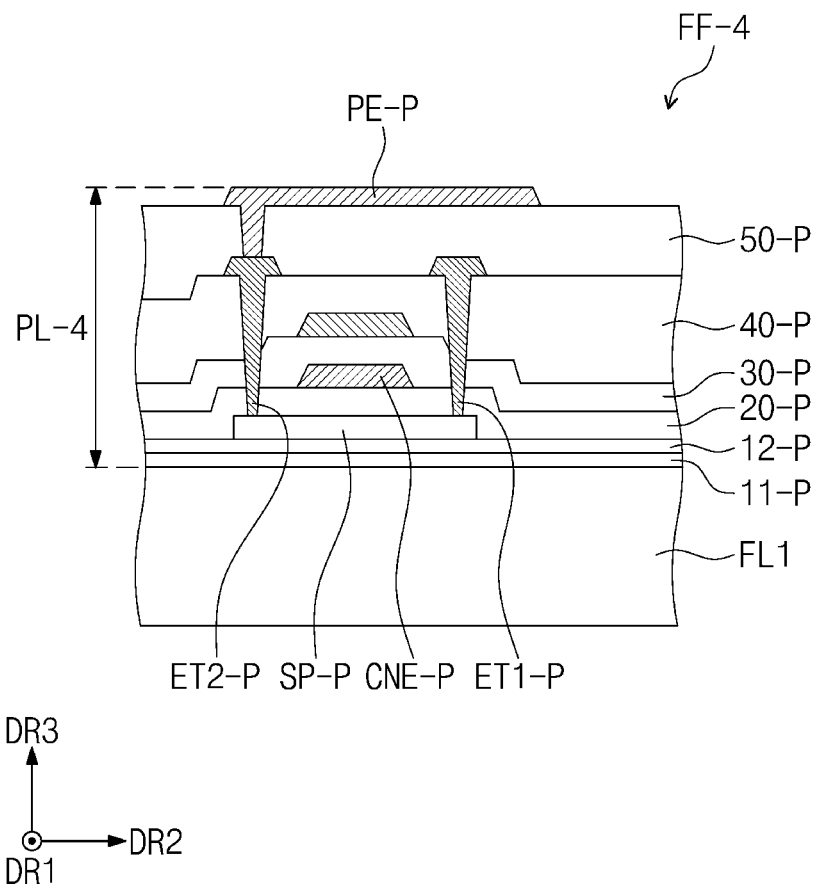
FIG. 13 is an enlarged cross-sectional view illustrating yet another exemplary embodiment of a pattern film.

FIG. 13 is an enlarged cross-sectional view illustrating yet another exemplary embodiment of a pattern film FF-4.

Referring to FIGS. 9 and 13, the pattern film FF-4 may include a first film FL1 and a pattern layer PL-4. Referring to the pattern layer PL-1 described in FIG. 10, the pattern layer PL-4 of FIG. 13 may not include layers of the display panel DP disposed on the pixel circuit layer PX-CL. Accordingly, the first pattern layer PL-4 may have the same stacked structure as the pixel circuit layer PX-CL.

The pattern film FF and the pattern film FFa described with reference to FIGS. 2 to 4 may be changed to the pattern films FF-1, FF-2, FF-3 and FF-4 described with reference to FIGS. 10 to 13.

Although exemplary embodiments of the present disclosure have been described, it is understood that the invention should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the invention shall be determined according to the attached claims.

What is claimed is:

1. A display device comprising:
a display panel comprising:
a display area at which an image is displayed and a bezel area which is adjacent to the display area,
a first film corresponding to the display area and the bezel area, and
a pixel on the first film, the pixel comprising a pixel circuit and a light emitting layer, the pixel circuit defining a stacked structure;
a window; and
a pattern film between the display panel and the window, the pattern film comprising:
a second film comprising a first area and a second area which respectively correspond to the display area and the bezel area of the display panel, and
a pattern layer on the second film in the second area thereof,
wherein the pattern layer of the pattern film includes a same stacked structure as the stacked structure defined by the pixel circuit of the display panel.

2. The display device of claim 1, further comprising a polarizing film between the window and the pattern film, wherein the polarizing film corresponds to both the first area and the second area of the pattern film.

3. The display device of claim 1, wherein the display panel further comprises a dummy pixel comprising a dummy pixel circuit and a dummy light emitting layer.

4. The display device of claim 3, wherein the pixel of the display panel corresponds to the display area of the display panel and the dummy pixel corresponds to the bezel area of the display panel.

5. The display device of claim 3, wherein the dummy pixel is provided in plural comprising a plurality of dummy pixels respectively corresponding to the first area and the second area of the pattern film.

6. The display device of claim 1, wherein the pattern layer of the pattern film is between the window and the second film of the pattern film.

7. The display device of claim 1, wherein the pattern layer is between the display panel and the second film of the pattern film.

8. The display device of claim 1, wherein
the pattern layer comprises a first sub-pattern layer and a second sub-pattern layer disposed in order from the second film,
the first sub-pattern layer has a same stacked structure as the stacked structure defined by the pixel circuit, and
the second sub-pattern layer comprises a same material as the light emitting layer.

9. The display device of claim 1, wherein the display panel further comprises a thin film encapsulation layer covering the light emitting layer.

10. The display device of claim 9, wherein
the thin film encapsulation layer defines a stacked structure,
the pattern layer comprises a first sub-pattern layer and a second sub-pattern layer disposed in order from the second film,
the first sub-pattern layer has a same stacked structure as the stacked structure defined by the pixel circuit, and
the second sub-pattern layer has a same stacked structure as the stacked structure defined by the thin film encapsulation layer.

11. The display device of claim 9, wherein
the thin film encapsulation layer defines a stacked structure,
the pattern layer comprises a first sub-pattern layer, a second sub-pattern layer and a third sub-pattern layer disposed in order from the second film,
the first sub-pattern layer has a same stacked structure as the stacked structure defined by the pixel circuit,
the second sub-pattern layer comprises a same material as the light emitting layer, and
the third sub-pattern layer has a same stacked structure as the stacked structure defined by the thin film encapsulation layer.

12. The display device of claim 1, further comprising a colored adhesive layer facing the pattern film with the display panel disposed therebetween.

13. The display device of claim 1, further comprising an input sensing layer between the display panel and the second film of the pattern film.

14. The display device of claim 1, wherein a reflectance and a transmittance of external light incident to the display device at an area corresponding to the display area of the display panel are respectively equal to a reflectance and a transmittance of external light incident to the display device at an area corresponding to the second area of the pattern film.

15. A display device comprising:
a display panel comprising:
a display area at which an image is displayed, the display area comprising a pixel circuit having a stacked structure, and
a bezel area which is adjacent to the display area;
a window; and
a pattern film between the display panel and the window, the pattern film comprising:
a first film comprising a transmission area corresponding to the display area of the display panel, and
a pattern layer on the first film and corresponding to the bezel area of the display panel, the pattern layer having a stacked structure having the same materials as those used for the stacked structure of the pixel circuit.

16. The display device of claim 15, wherein the display panel further comprises:
a second film corresponding to the display area and the bezel area, and
a pixel on the second film, the pixel comprising the pixel circuit and a light emitting layer, and
the pattern layer comprises a first sub-pattern layer having a same stacked structure as the stacked structure defined by the pixel circuit.

17. The display device of claim 16, wherein
the light emitting layer defines a stacked structure, and
the pattern layer further comprises a second sub-pattern layer facing the first film with the first sub-pattern layer therebetween, the second sub-pattern layer and having a same stacked structure as the stacked structure defined by the light emitting layer.

18. The display device of claim 16, further comprising an encapsulation layer covering the pixel, the encapsulation layer defining a stacked structure,
wherein the pattern layer further comprises a second sub-pattern layer facing the first film with the first sub-pattern layer therebetween, the second sub-pattern layer having a same stacked structure as the stacked structure defined by the encapsulation layer.

19. The display device of claim 15, further comprising a polarizing film between the window and the pattern film, wherein a planar area of the polarizing film is equal to a planar area of the window.

20. The display device of claim 15, wherein
the display panel further comprises a plurality of dummy pixels each comprising a dummy pixel circuit and a dummy light emitting layer,
the pixel of the display panel corresponds to the display area of the display panel, and
the plurality of dummy pixels correspond to the transmission area and the pattern layer of the pattern film.

* * * * *